United States Patent
Saitoh et al.

(10) Patent No.: US 6,589,453 B1
(45) Date of Patent: Jul. 8, 2003

(54) PROCESS FOR PREPARING A TARGET FOR USE IN THE PRODUCTION OF A THIN METAL OXIDE FILM

(75) Inventors: Hidetoshi Saitoh, 1769-1, Fukasawamachi, Nagaoka-shi, Niigata-ken (JP); Shigeo Ohshio, Koshiji-machi (JP); Ryo Satoh, Nagaoka (JP); Nobuyoshi Nambu, Yokkaichi (JP); Atsushi Nakamura, Yokkaichi (JP); Masanori Furukawa, Yokkaichi (JP)

(73) Assignees: Chubu Chelest Co., Ltd., Osaka (JP); Hidetoshi Saitoh, Nagaoka (JP)

( * ) Notice: Subject to any disclaimer, the term of this patent is extended or adjusted under 35 U.S.C. 154(b) by 0 days.

(21) Appl. No.: 09/673,920

(22) PCT Filed: Apr. 16, 1999

(86) PCT No.: PCT/JP99/02053
§ 371 (c)(1),
(2), (4) Date: Dec. 13, 2000

(87) PCT Pub. No.: WO99/55619
PCT Pub. Date: Nov. 4, 1999

(30) Foreign Application Priority Data

Apr. 24, 1998 (JP) .......................................... 10-115461
Sep. 30, 1998 (JP) .......................................... 10-227492

(51) Int. Cl.$^7$ .............................. B29B 9/00; B29B 11/12
(52) U.S. Cl. ............................... 264/6; 264/5; 264/115; 264/123
(58) Field of Search ...................... 264/5, 6, 13, 109, 264/115, 123; 505/425, 445, 446, 474, 512; 427/126.3

(56) References Cited

U.S. PATENT DOCUMENTS

| | | | | | |
|---|---|---|---|---|---|
| 3,927,155 | A | * | 12/1975 | Jaeger et al. | 264/681 |
| 4,975,415 | A | * | 12/1990 | Gusman et al. | 505/425 |
| 5,006,504 | A | * | 4/1991 | O'Bryan et al. | 505/425 |
| 5,266,243 | A | * | 11/1993 | Kneller et al. | 264/661 |
| 5,294,599 | A | * | 3/1994 | Shibata et al. | 505/440 |
| 5,304,536 | A | * | 4/1994 | Horowitz | 505/445 |
| 5,407,618 | A | * | 4/1995 | Stephenson | 501/12 |
| 5,413,988 | A | * | 5/1995 | Hayashi et al. | 505/473 |
| 5,534,468 | A | * | 7/1996 | Stephenson | |
| 5,614,472 | A | * | 3/1997 | Riddle et al. | 505/425 |
| 5,660,774 | A | * | 8/1997 | Stangle et al. | 505/425 |
| 5,728,362 | A | * | 3/1998 | Greuter et al. | |
| 5,814,585 | A | * | 9/1998 | Riddle et al. | 505/425 |

FOREIGN PATENT DOCUMENTS

| | | | | |
|---|---|---|---|---|
| DE | 4127852 A1 | * | 2/1993 | C01F/1/00 |
| EP | 0842911 | * | 5/1998 | |

* cited by examiner

Primary Examiner—Stephen J. Lechert, Jr.
(74) Attorney, Agent, or Firm—Smith Patent Office

(57) ABSTRACT

A process for preparing a target for use in production of a thin metal oxide film that comprises molding an amorphous powder of organic metal chelate complexes to obtain the target. The process also includes mixing metallic materials with an organic chelating agent so as to give a predetermined metal composition to prepare a transparent aqueous solution of organic metal chelate complexes. The process also includes spray-drying the aqueous solution to obtain an amorphous powder of the organic metal chelate complexes.

11 Claims, 15 Drawing Sheets

RAW MATERIAL EDTA (AMORPHOUS)

RAW MATERIAL EDTA (CRYSTAL)

450°C(AMORPHOUS)

450°C(CRYSTAL)

RAW MATERIAL EDTA (AMORPHOUS)

RAW MATERIAL EDTA (CRYSTAL)

450°C(AMORPHOUS)

450°C(CRYSTAL)

600°C(AMORPHOUS)

600°C(CRYSTAL)

800°C(AMORPHOUS)

800°C(CRYSTAL)

1000°C(AMORPHOUS)

1000°C(CRYSTAL)

PROCESS FOR PREPARING A TARGET FOR USE IN THE PRODUCTION OF A THIN METAL OXIDE FILM

This application claims benefit under 35 U.S.C. 371 of PCT/JP99/02053 filed Apr. 16, 1999.

TECHNICAL FIELD

The present invention relates to a target having a satisfactorily controllable composition, with which a thin metal oxide film having a proper composition can be efficiently produced by laser deposition method, process for producing the target, and process for forming the thin metal oxide film by using the target.

BACKGROUND ART

One of the most general methods for producing a metal oxide is a solid-phase method, in which solid-phase raw materials such as carbonate and oxide are mixed so as to give a desired metal oxide composition rate and then sintered to obtain a metal oxide. In the method, however, the obtained metal oxide obviously has a heterogeneous phase microscopically, since solid phases of the respective materials are mixed with each other to be sintered. In particular, in case of synthesizing a multi-element oxide which requires starting materials having a highly homogeneity, it is inevitable that the obtained metal oxide composition shift undesirably due to generation of a different phase. In order to obtain a homogeneous starting material, it is necessary to be synthesized through a homogeneous system from a starting raw material. As such a method, known have been liquid-phase methods based on chemical processes such as a sol-gel method and a coprecipitation method.

According to these conventional liquid-phase methods, however, it is not easy to avoid the essential problem of the heterogeneous system. The reason is as follows. Even if the starting solution is homogeneous, each kind of metal compound therein has its own hydrolysis rate and solubility product etc. The various hydrolysis rates and solubility products inevitably make this system heterogeneous in the following steps of, for example, hydrolysis, neutralization and precipitation, although the obtained powder included in the system is a fine powder. To solve the above problem, proposed has been a method including forming a metal complex between a metal ion and polycarboxylic acid, e.g., citric acid, in an aqueous phase, and then adding polyhydric alcohol, e.g., ethylene glycol, as a crosslinking agent for an ester polymerization to obtain a gel complex polymer.

In this method, however, a part of the metal may separate from the metal complex in the ester polymerization step and this may result in the segregation. In addition, in case of using the obtained complex polymer as a starting material, the product obtained by sintering the gel complex polymer needs to be pulverized finely. It is pointed out that the pulverization step may results in problems such as raising the manufacturing cost and complicating the work procedure.

Besides these, various methods for synthesizing a starting material have been proposed. But any of the methods is not suitable for versatile use because of the high manufacturing cost and complicated operation.

A method for synthesizing ceramics from metal chelate complexes has been developed recently. This method is remarkable because of its possibility of suppressing the undesirable metal composition shift. In this method, however, an appropriate means for mixing solid-phase metal chelate complexes homogeneously at a molecular level has not been found. Thus, the method does not sufficiently make use of the advantage of the metal chelate complexes.

In addition, in any of the conventional methods for producing a metal oxide powder that are practically used currently, it is almost impossible to control, for example, the particle shape and particle size of the obtained powder.

On the other hand, as a method for producing a thin film of multi-element metal oxide, chemical vapor deposition (CVD) and physical vapor deposition (PVD) has been known. In CVD, a raw material is caused to react in a gaseous-phase state and the objective compound is separated out in a solid-phase state. In PVD, a solid raw material (target) is vaporized by the injection of physical energy to rearrange the vaporized material into a thin oxide film on a substrate. Of these, CVD has a drawback that a different phase is likely to be separated during the intermediate reaction due to various vapor pressures of respective kinds of raw materials. For this reason, when CVD is applied to the method of producing a multi-element metal oxide, it is considered to be difficult to control the composition of the obtained metal oxide. On the other hand, sputtering, which is a typical PVD process, is for versatile use, while it has a drawback that the compositional control is considerably difficult to be made in case of using a compound target. This is because the use of an identical compound target for a long period of time may change the composition of the target.

In order to improve the problem of the compositional control, developed has been a laser deposition method (laser abrasion) in which a target is clustered by a laser irradiation to rearrange the compounds contained in the target on a substrate. However, strong laser energy has been needed for clustering the conventional targets, since they have strong bonds such as ionic and covalent bonds. Additionally, large agglomerated molecules (droplet) of the target material may drop on the substrate, resulting in a problem that a heterogeneous thin film (i.e., a thin film having a rough surface) is obtained.

In order to solve the problem, it has been tried to provide a cloison between the target and the substrate to suppress the deposit of such a droplet on the substrate. Using the cloison, however, is only a physical means and it cannot be said a fundamental solution. In addition, the obtained thin film according to PVD is originally no better than a thin film in which the compounds in the target are rearranged. Thus, the thin oxide film quality depends on the target quality. It is therefore necessary to prepare a high-quality target. But, it is difficult to synthesize a high-quality homogeneous bulk of multi-element metal oxide to be used as the target. The synthesis also needs a lot of time and effort, and thereby the synthesis step may be the rate-determining step, resulting in a disadvantageously high cost.

The present invention is intended to overcome the aforementioned conventional problems. It is therefore an object of the invention to provide a target having homogeneity at a molecular level in any component system. The target can be used for a speedily, low-energy and low-cost production of a high-quality thin metal oxide film, especially thin film of multi-element metal oxide, having a proper-controlled composition and a satisfactory surface smoothness. It is another object of the invention to provide a method for producing the above-mentioned target easily. A further object of the invention is to provide a method for effectively forming the above-mentioned thin metal oxide film having a proper-controlled composition with using the target.

Disclosure of Invention

According to the present invention, the target for forming a thin metal oxide film, which can achieve the aforementioned objects, the target for forming a thin metal oxide film, which can achieve the aforementioned objects, is distinctively obtained by molding an amorphous powder of organic metal chelate complexes into the shape of a tablet. The preferable method for producing such a target is as follows. Metallic materials are mixed with an organic chelating agent so as to give a predetermined metal composition, to prepare a transparent aqueous solution of organic metal chelate complexes. The aqueous solution is then spray-dried to obtain an amorphous powder of the organic metal chelate complexes in which the complexes are mixed with each other at a molecular level, followed by the press molding to shape into a tablet.

As the organic chelating agent in this case, preferably used may be an amino-carboxylic acid chelating agent which is not thermally decomposed at 200° C. or less. In addition, the chelating agent with at least stoichiometric quantity of a total of respective metallic material is preferably mixed with the metallic materials so as to allow all of the metallic materials for forming complexes completely, to obtain a transparent aqueous solution. Moreover, when the metallic materials contain the metal which is easy to be oxidized by air to be a metal oxide or a higher-valence metal ion, a reducing agent and/or an antioxidant may be added to the aqueous solution of the organic metal chelate complexes to prevent oxidation of the metal ions in the solution. For example, when the metallic materials contain titanium, a reducing agent may be effectively added to stabilize titanium (III).

When the laser deposition method is applied to the production of a thin film by the use of the above-mentioned target, a composition of the obtained thin metal oxide film is easily controllable in any composition system. And also, by such a method, a thin metal oxide film having a satisfactory surface smoothness without a defect can be obtained speedily with lower energy and lower cost.

Accordingly, this method is, in a high degree of efficiency, applicable to the formation of a high-temperature superconductive thin film of multi-element metal oxide such as thin films of $YBa_2Cu_3O_{7-\delta}$ and $SrTiO_3$.

BEST MODE FOR CARRYING OUT THE INVENTION

The present invention is configured as described above. In brief, the present invention provides a target obtained by molding an amorphous powder of organic metal chelate complexes into a tablet. The amorphous powder of organic metal oxide complexes can produce a metal oxide by sintering at a relatively lower sintering temperature (for example, 100–250° C. lower) than that of the conventional method for producing an oxide as above described.

The amorphous organic metal chelate complexes used as a raw material in the present invention exhibits a halo due to scattering of the incident x-ray in the x-ray diffraction, as proved in the following practical example (see FIG. 1). This means the organic metal chelate complexes have a crystal structure of amorphous. Thus, when the metal chelate complexes in a liquid phase, which is homogeneous phase, are dried immediately by a spray drying method of the like, the complexes transform into a solid phase with the phase homogeneity being remained. Even in case of multi-element organic metal chelate complexes, the complexes are mixed homogeneously with each other at a molecular level in the powder obtained by such a drying method. That is, the obtained powder is amorphous in which molecules aggregate without being crystallized. (The powder in a crystallizing state has microscopic difference in regularity therein. The regularity of the amorphous powder is extremely lower than that of the crystalline powder according to the conventional technology, thereby to distinguish from crystalline complex).

Figure 2:
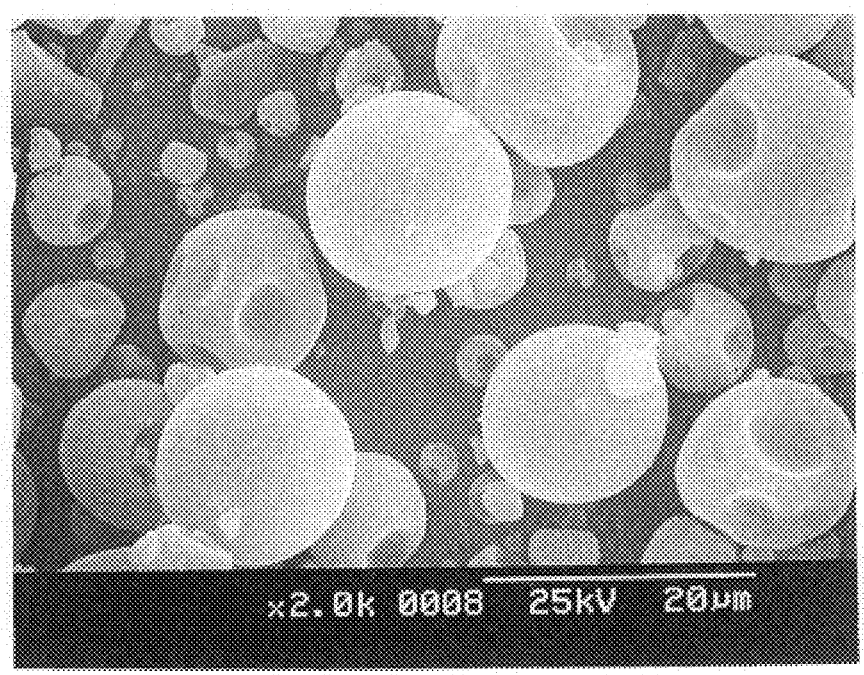
FIG. 2 is a picture by SEM of the amorphous powder that was used as a raw material for producing the metal oxide powder in practical example 1.

In addition, the powder of organic metal chelate complexes obtained by the spray drying (referring to as "amorphous powder" hereinafter) has an approximately spherical particle shape (see FIG. 2). When the powder is sintered, the particle shape remains unchanged to obtain a ceramic (metal oxide) powder. Accordingly, it is possible to adjust the particle shape of the obtained metal oxide powder desirably by the adjustment of the particle shape of the amorphous powder through a control of powdering conditions in the spray-drying process.

Moreover, the metal oxide powder obtained from the amorphous powder has an approximately spherical particle shape and thereby it is non-directional as describe above. Therefore, when the spherical-shaped powder is used as a starting raw material for molding, it is possible to increase the packing rate uniformly, compared with a case of using a starting material having any other particle shape. For this reason, this metal oxide powder may be effectively used for synthesizing high-density ceramics such as YAG (Yttrium Aluminum Garnet) and stabilized zirconia.

In addition, the amorphous powder containing the metal chelate complexes may be press-molded into a bulk, followed by sintering to obtain a bulk of metal oxide. Alternatively, the metal oxide powder obtained by sintering may be press-molded into a bulk. Moreover, the amorphous powder as a starting material may be mixed with a further raw material and then sintered to obtain a metal oxide of a new composition.

According to the present invention, the target is obtained by molding the amorphous powder of the metal chelate complexes into a tablet. The metal complexes can be clustered and then easily removed from the target by the laser irradiation on the target. When the clustered metal complexes are caused to fall on a heated substrate, they are instantaneously thermally decomposed into a metal oxide so as to allow the epitaxial growth of the metal oxide on the substrate. This makes it possible to form the desired thin metal oxide film easily.

Then, a method for producing the amorphous organic metal chelate complexes is explained in detail below. First of all, respective metallic materials are measured so as to give a predetermined metal composition. The measured materials are caused to react with an organic chelating agent to prepare a transparent aqueous solution or organic metal chelate complexes. The reaction is performed in an aquosity medium at 20 to 100° C., preferably 50 to 70° C. The concentration of the aqueous solution may be adjusted to have a solid content of 5 to 3% by weight, preferably 10 to 20% by weight. In addition, the amount of the organic chelating agent can be arbitrarily determined, as long as the amount exceeds the total equivalent of metallic ions. The preferable amount of the chelating agent is 1.0 to 1.5 times in mole as much as the total equivalent of metallic ions. In case that the metal chelate complexes or the organic chelating agent does not dissolve in the medium completely, ammonia, amine or the like can be added for the complete dissolution.

One of the main problems for producing the functional metal oxide is that an impure metal may contaminate the product of metal oxide. In particular, use of sodium and potassium salts and the like should be avoided in the system for producing the organic metal chelate complexes. This is because such a salt is likely to remain in the thin film after a step of the thermal decomposition, and result in the compositional deviation of the resultant thin film. For the same reason, if containing chlorine, sulfur, phosphorus and/or the like, use of inorganic acids and inorganic salts (hydrochloric acid, sulfuric acid, phosphoric acid or salts of these etc.) and further organic matters (thiol compounds etc.) also should be avoided. The other compounds (organic matters containing no chlorine, sulfur, phosphorus and/or the like, nitric acid, nitrate, ammonia etc.) may be added to the metal chelate complexes in an appropriate amount if necessary, since those compounds can be decomposed in the thermal decomposition step or sintering step. An excessive large amount of those compounds, however, is likely to contaminate the thin film due to impurities contained in the compounds. Therefore, it is desirable to add such a compound in at least sufficient amount.

According to the invention, the organic chelating agent may include aqueous amino-carboxylic acid chelating agents such as ethylenediaminetetraacetic acid, 1,2-cyclohexanediaminetetraacetic acid, dihydroxyethylglycine, diaminopropanoltetraacetic acid, diethylenetriaminepentaacetic acid, ethylenediaminediacetic acid, ethylenediaminedipropionic acid, hydroxyethylenediaminetriacetic acid, glycoletherdiaminetetraacetic acid, hexamethylenediaminetetraacetic acid, ethylenediamined(o-hydroxyphenyl)acetic acid, hydroxethyliminodiacetic acid, iminodiacetic acid, 1,3-diaminopropanetetraacetic acid, 1,2-diaminopropanetetraacetic acid, nitrilotriacetic acid, nitrilotripropionic acid, triethylenetetraminehexaacetic acid, ethylenediaminedisuccinic acid, 1,3-diaminopropanedisuccinic acid, glutamic acid-N,N-diacetic acid and aspartic acid-N,N-diacetic acid. Any of monomer, oligomer and polymer of these amino-carboxylic acids can be used.

However, in case of using such a chelating agent as a free acid type, ammonium salt and amine salt, the chelating agent is preferably selected appropriately for each metallic material to be used, considering a chelating constant, stability of the chelate complexes and further solubility of the chelate complexes to water or alkaline aqueous solution etc.

On the other hand, the metallic materials to be used in the present invention may include various forms such as carbonate, nitrate, hydride and oxide. The most preferable metallic material is carbonate which is excellent in reactivity and thereby leaves no extra ion after the reaction. In addition, in case that the metallic material has a poor reactivity or that the metallic material is not capable of forming carbonate, nitrate and hydride but is capable of forming a considerably stable oxide (e.g., titanium), a solution of organic chelate complexes is firstly prepared using the chloride or sulfate of the metallic material, followed by crystallization to prepare a high purity crystal of the organic chelate complexes. The prepared crystal is desirably used as a starting material for preparing the aqueous solution of the complexes.

Furthermore, according to a kind of the metal, an ion of the metal may be oxidized in the aqueous solution by contacting with air to produce a metal oxide or a metal ion having a low valence number will change to a metal ion having a higher valence number. This may cause problems of solubility and stability in the aqueous solution. In a specific example of using titanium as one of metallic components, used may be an organic chelate complex of titanium (III) having the following property. The titanium (III) ion may be oxidized in the aqueous solution by contacting with air to produce titanium (IV) that is unstable in an aqueous phase, which may be further oxidized into titanium oxide. Accordingly, in case of using such a metallic material which has the above-mentioned property, it is preferred to add a reducing agent or an antioxidant to the processing system to stabilize the metal ion in addition to inhibiting the oxidation of the metal. Then the aqueous solution of the organic metal chelate complexes is preferably prepared by mixing the chelating agent with adjusted stoichiometric quantity of the metallic materials so that complex salts of other metal ions are formed to give a completely transparent aqueous solution. The reducing agent (or an antioxidant) in this case may include ascorbic acid, isoascorbic acid, oxalic acid and hdyrazine and the like.

The aqueous solution of the organic metal chelate complexes prepared as above described is then dried to obtain a powder. As the method for obtaining a solid phase by drying up a liquid phase, various general drying methods such as a vacuum drying and a film evaporating can be applied. Any of these general methods, however, cannot give a microscopically homogeneous powder easily due to the segregation of a particular metal salt during the drying process. Thus, in order to avoid such a problem, a spray-drying method is favorably applied to the present invention to obtain a homogeneous powder by the instantaneous drying.

The operating conditions of the spray drying can be determined appropriately depending on the concentration of the solution, the processing rate of the solution, the amount of air to be sprayed, the supplying amount of hot-air and the like. The drying temperature is usually set within a range having an upper limit on or below the organic matter can remain undecomposed and a lower limit on or beyond which the solution can be dried sufficiently. From this point of view, the drying temperature is preferably about 100 to 200° C., more preferably 140 to 180° C. In addition, in view of the preferable drying temperature, it is preferred that the aminocarboxylic acid chelating agent to be used in the present invention is not decomposed at 200° C. or less.

The amorphous powder obtained by the spray drying may be used in the powdery form, or may be formed arbitrary into, for example, a bulk or a thin film, depending on its application. The amorphous powder is subsequently sintered at a relatively low temperature of, for example, about 500 to 800° C. to obtain a desirably-shaped metal oxide.

In addition, the target produced by forming the powder of the organic metal chelate complexes into a tablet can be considerably effective as a raw material for producing a thin metal oxide film by the laser deposition method. The method for forming the powder into a tablet may not be limited, if the obtained tablet has a strength to some extent. The preferable method is a cold isotropic pressing (CIP), and the preferable compacting pressure in this method is about 200 to 1000 kg/m3. The tablet preferably has a thin cylindrical shape, from the viewpoints of the tablet strength and the cooling efficiency thereof after heating by a laser irradiation.

When the tablet is used as a target to be irradiated by a laser in an oxygen atmosphere, minute uniform clusters are more likely to be formed. This is because chemical bonds between organic metal chelate complexes are considerably softer than an ionic bond and a covalent bond. When the clusters are subsequently deposited on a heated substrate, the organic matter are immediately thermally decomposed, thereby forming a thin film of the metal oxide crystal by an epitaxial growth of the metallic element (component).

Even in case that a droplet is made for some reason, the effect on the obtained thin film is minimized because of a large decrease of the droplet volume resulting from the thermal decomposition of the organic matter. In the resultant thin metal oxide film, no extraordinary growth of grains is observed. And it was also found that the film has an excellent surface smoothness. According to the method, as shown in the following examples, also formed can be a high-quality thin metal oxide film such as thin films of $YBa_2Cu_3O_{7-\delta}$ (the symbol "$\delta$" represents a defect amount of oxygen from the ideal crystal structure), and $SrTiO_3$ speedily with a lower cost.

According to the present invention, the starting material for producing a metal oxide is obtained by molding the amorphous powder of organic chelate metal complexes into a tablet. When using the tablet as a target to be applied to, for example, the laser deposition method a thin metal oxide film having an excellent surface smoothness can be obtained easily through an epitaxial growth with the composition of the thin film being highly controlled. This method is extremely effective for producing a high-quality thin metal oxide, especially a thin multi-element oxide film, which has not been produced easily by the conventional methods.

Particularly, it is desired to apply to a technical development of electrical devices having a high-temperature superconductive metal oxide, which is a typical multi-element metal oxide. Such electrical devices include a Josephson device and a superconducting quantum interference device (SQUID). It is further desired to apply the present invention to a thin-film light modulation/light switch device, piezoelectric device, pyroelectric device, surface acoustic wave (SAW) device, a thin film for optomagnetic memory, a transparent conductive film and the like.

The present invention is widely and effectively applied for producing a multi-element metal oxide, especially a thin film thereof, as described above. In addition, the method is applicable to a technology for forming a single-element metal oxide and a thin film thereof.

EXAMPLES

The invention is now described in further detail with reference to some practical examples of its embodiment. It is to be understood that the present invention is not limited to the following practical examples, but various modifications may be made without departing from the spirit of the aforementioned and the following description and such modification is within the scope of the invention.

Practical Example 1

53.611 g (0.18×1.02 mol) of the ethylenediaminetetraacetic acid was mixed with water in a 500 ml beaker so as to give a total amount of 400 g, followed by stirring and heating. Then, with stirring at a liquid temperature of 60° C., 6.522 g (yttrium: 0.03 mol) of dihydrate of yttrium carbonate (yttrium amount: 40.9%), 11.939 g (barium:0.06 mol) of barium carbonate (barium amount: 69.0% and 10.305 g (copper: 0.09 mol) of copper carbonate (basic) (copper amount: 55.5%) were slowly added in sequence not to overflow the mixture.

After the mixture was maintained at 60° C. for 30 minutes, the mixture was cooled to the room temperature. Subsequently 35.8 g of ammonia water was added to obtain a reaction liquid of pH 8.4 in which the products in the mixture completely dissolved. To the reaction liquid, water was added so as to give a total amount of 500 g, to obtain a transparent dark blue aqueous solution of the organic metal chelate complex mixture.

The aqueous solution was dried by using a spray dryer at a drying temperature of 150° C. and a solution processing rate of 350 ml/hr to obtain 55 g of an amorphous powder of the organic metal chelate complex mixture.

Figure 1:
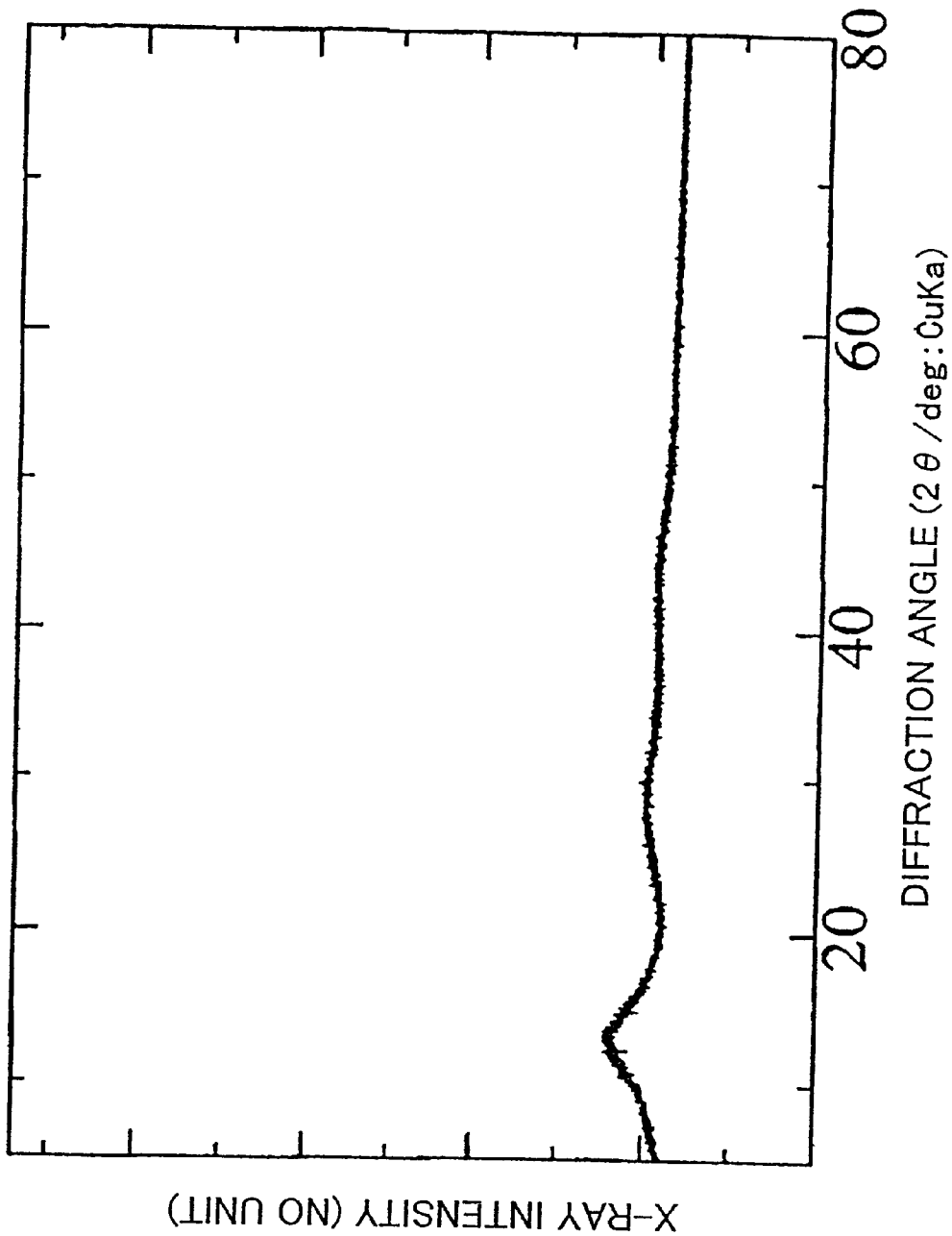
FIG. 1 is a graph showing an X-ray diffraction spectrum of the amorphous powder that was used as a raw material for producing the metal oxide powder in practical example 1.

FIG. 1 shows an X-ray diffraction chart of the powder. In this figure, a halo due to the scattering of the incident X-ray is found. It is apparent that the powder has a crystal structure of amorphous (i.e., non-crystalline). FIG. 2 is a SEM photograph of the powder and shows that each particle in the powder has an approximately sphere shape.

The obtained amorphous powder was then sintered at 600° C., 700° C., 750° C. or 800° C. for 3 hours by using a nonpressure electric furnace to obtain a metal oxide powder.

Comparative Example 1

EDTA yttrium ammonium: 11.85 g (0.03 mol), EDTA barium diammonium: 27.68 g (0.06 mol) and EDTA copper diammonium: 34.88 g (0.09 mol) were respectively weighed and then they were mechanically well-mixed in a mortar. Subsequently, the obtained powder of the complex mixture was sintered at 600° C., 750° C. or 800° C. for 5 hours by using a nonpressure electric furnace to obtain a metal oxide powder.

Evaluation Test 1

Figure 3:
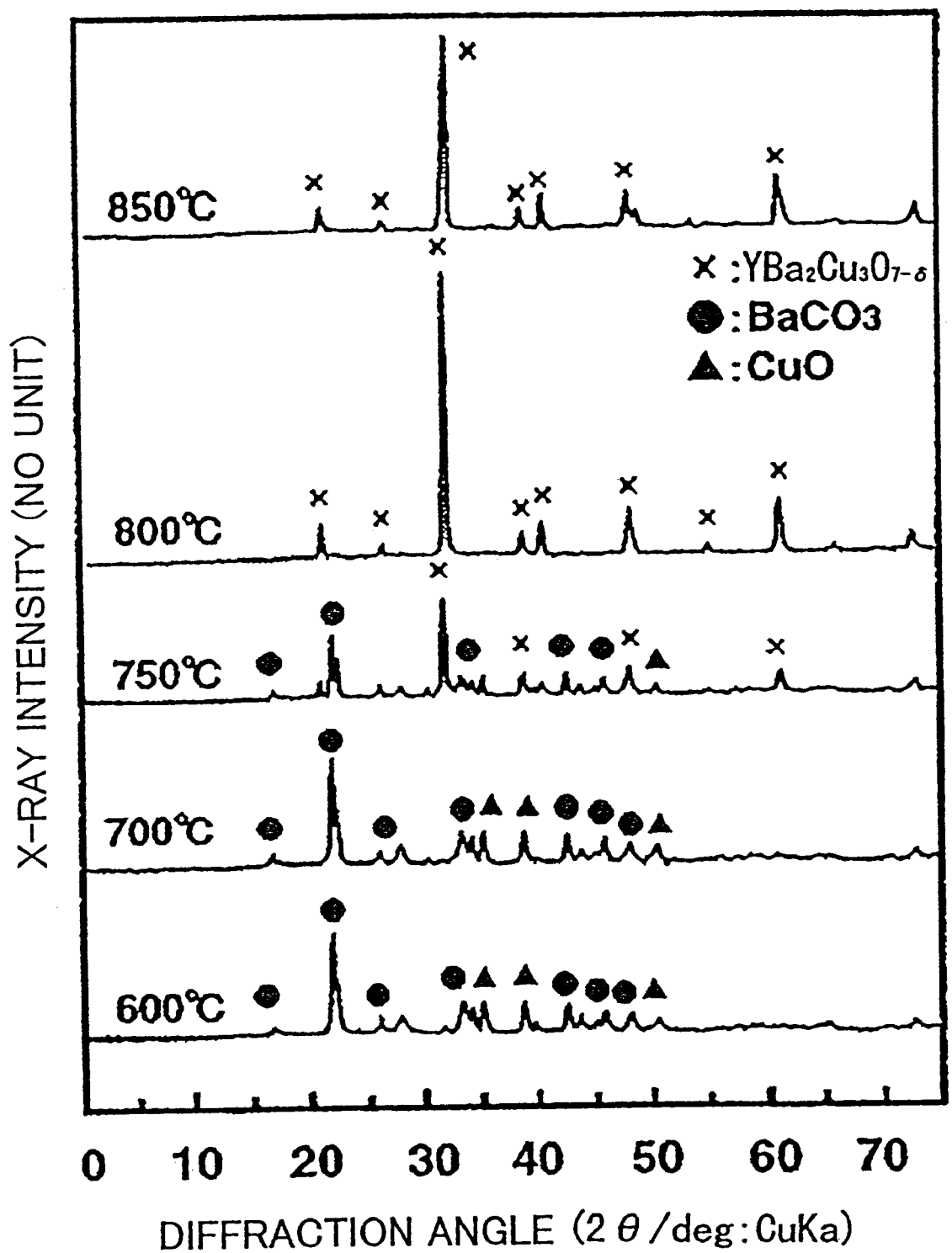
FIG. 3 is a graph showing an X-ray diffraction spectrum of the metal oxide powder obtained in practical example 1.
Figure 4:
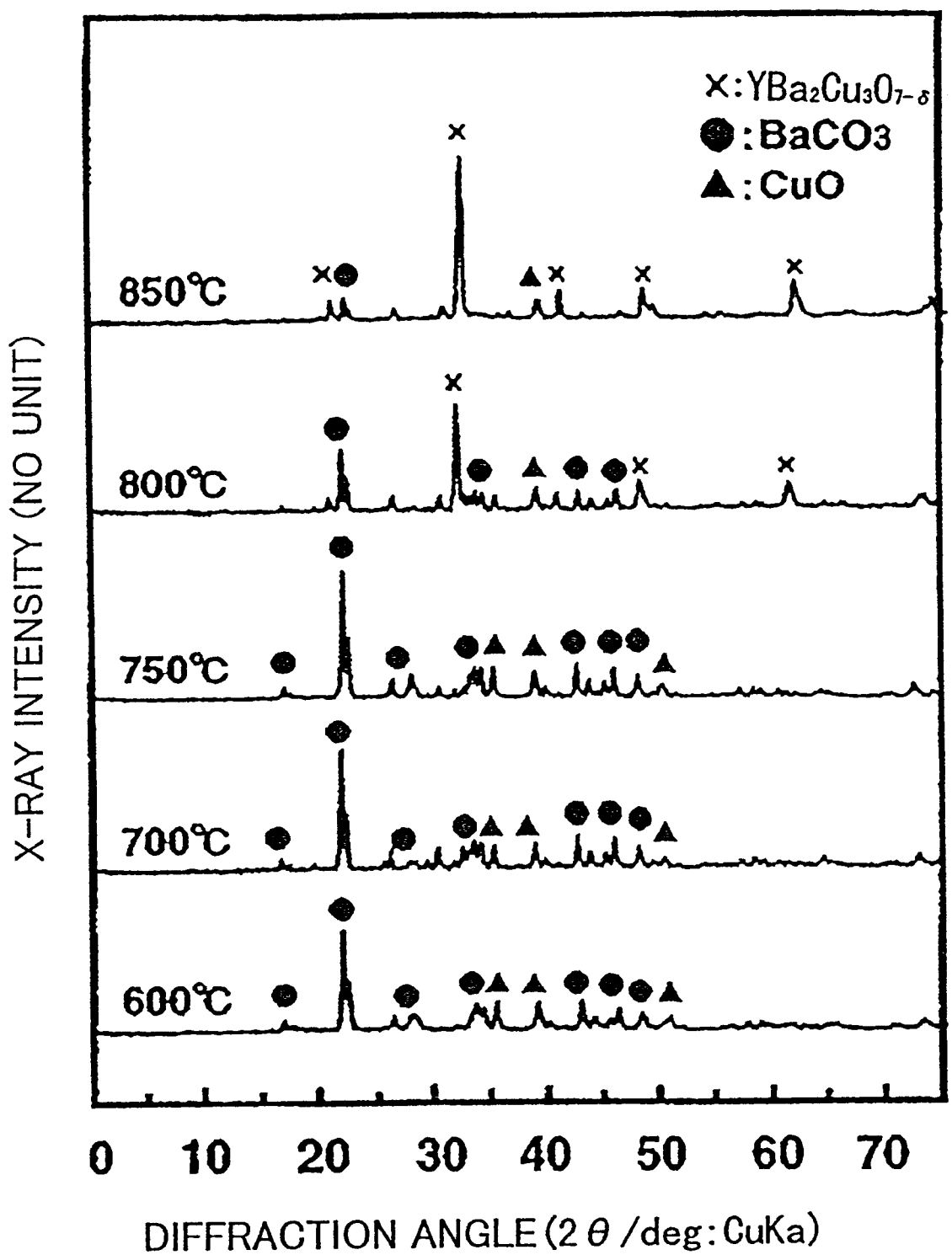
FIG. 4 is a graph showing an X-ray diffraction spectrum of the metal oxide powder obtained in comparative example 1.

FIGS. 3 and 4 respectively show x-ray diffraction spectra of the metal oxide powders obtained in practical example 1 and comparative example 1. As proved by comprising these figures, the powder in practical example 1 has a phase of $YBa_2Cu_3O_{7-\delta}$ at 750° C. and a single-phase of $YBa_2Cu_3O_{7-\delta}$ at 800° C., whereas the powder in comparative example 1 has a phase of $YBa_2Cu_3O_{7-\delta}$ at 800° C. and, in addition, different phases of $BaCO_3$ and $CuO$. Furthermore, even when the sintering temperature of the powder in comparative example 1 is raised to 850° C., the powder cannot has the $YBa_2Cu_3O_{7-\delta}$ phase as a single phase.

Practical Example 2

An amorphous powder of the organic metal chelate complex mixture was obtained in the same manner as practical example 1. The amorphous powder was molded into a cylindrical pellet having a diameter of 10 mm and a thickness of 5 mm by CIP at the pressure of 1000 kg/m$^2$, to be used as a target.

Comparative Example 2

An amorphous powder of the organic metal chelate complex mixture was obtained in the same manner as comparative example 1. The amorphous powder was molded into a cylindrical pellet having a diameter of 10 mm and a thickness of 5 mm by CIP at the pressure of 1000 kg/m$^2$, to be used as a target.

Evaluation Test 2

Figure 5:
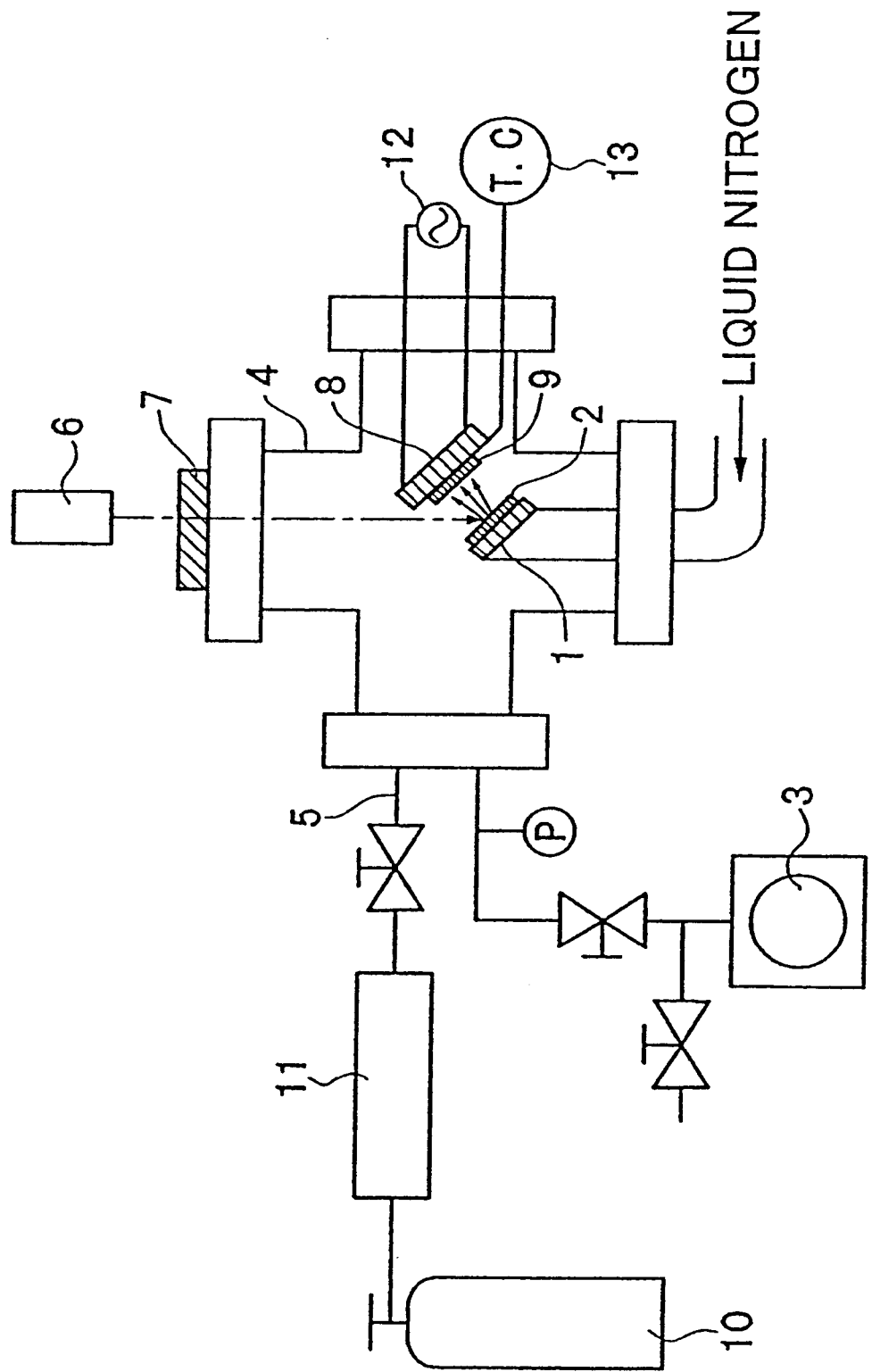
FIG. 5 is a schematic view showing a laser deposition apparatus that was used in the experiments.

By using respective targets obtained in practical example 2 and comparative example 2, a thin film of $YBa_2Cu_3O_{7-\delta}$ was deposited on a single-crystal substrate of $SrTiO_3$ (100) with an apparatus shown in FIG. 5.

FIG. 5 is a schematic view showing a laser deposition apparatus which was used in the experiments. The reference numeral "1" is a target-supporting table, "2" is a target, "3" is an oil-sealed rotary pump, "4" is a vacuum chamber, "5" is an oxygen inlet, "6" is a KrF-excimer laser, "7" is a quartz window for introducing laser, "8" is a substrate-heating table, "9" is a single-crystal substrate of $SrTiO_3$ (100), "10" is an oxygen bomb, "11" is a flowmeter, "12" is a heater and "13" is a temperature control device.

Using the respective targets, a thin metal oxide film was produced with the apparatus shown in FIG. 3 as follows. First of all, target 2 was mount on target-supporting table 1. Then a pressure in vacuum chamber 4 was reduced to 10$^{-2}$ Torr by oil-sealed rotary pump 3. Subsequently, an oxygen gas was introduced at a flow rate of 2ml/min thorough oxygen inlet 5 in such a manner that a partial pressure of oxygen was adjusted to 0.15 Torr constantly. Nd : YAG laser 6 (the forth high frequency: $\lambda$=266 nm) was irradiated on target 2 through quartz window for introducing laser 7. In the irradiation, a power density and a pulse rate were set to 0.3 J/cm$^2$ and 7 Hz respectively. By such an irradiation, a thin film of $Yba_2Cu_3O_{7-\delta}$ was deposited on single-crystal $SrTiO_3$ (100) substrate 9 on which had been heated to 850° C. by substrate-heating table 8. Target-supporting table 1 was constantly cooled by liquid nitrogen. The distance between target 2 and substrate 9 was set to 30 mm. The deposition time of the thin film was set to 20 minutes and then the change of the thin film was observed.

As to each obtained thin metal oxide film, the crystal structure analysis was performed by the x-ray diffraction. The x-ray diffraction spectra of the thin films in practical example 2 and comparative example 2 are shown in FIGS. 6 and 7 respectively.

Figure 6:
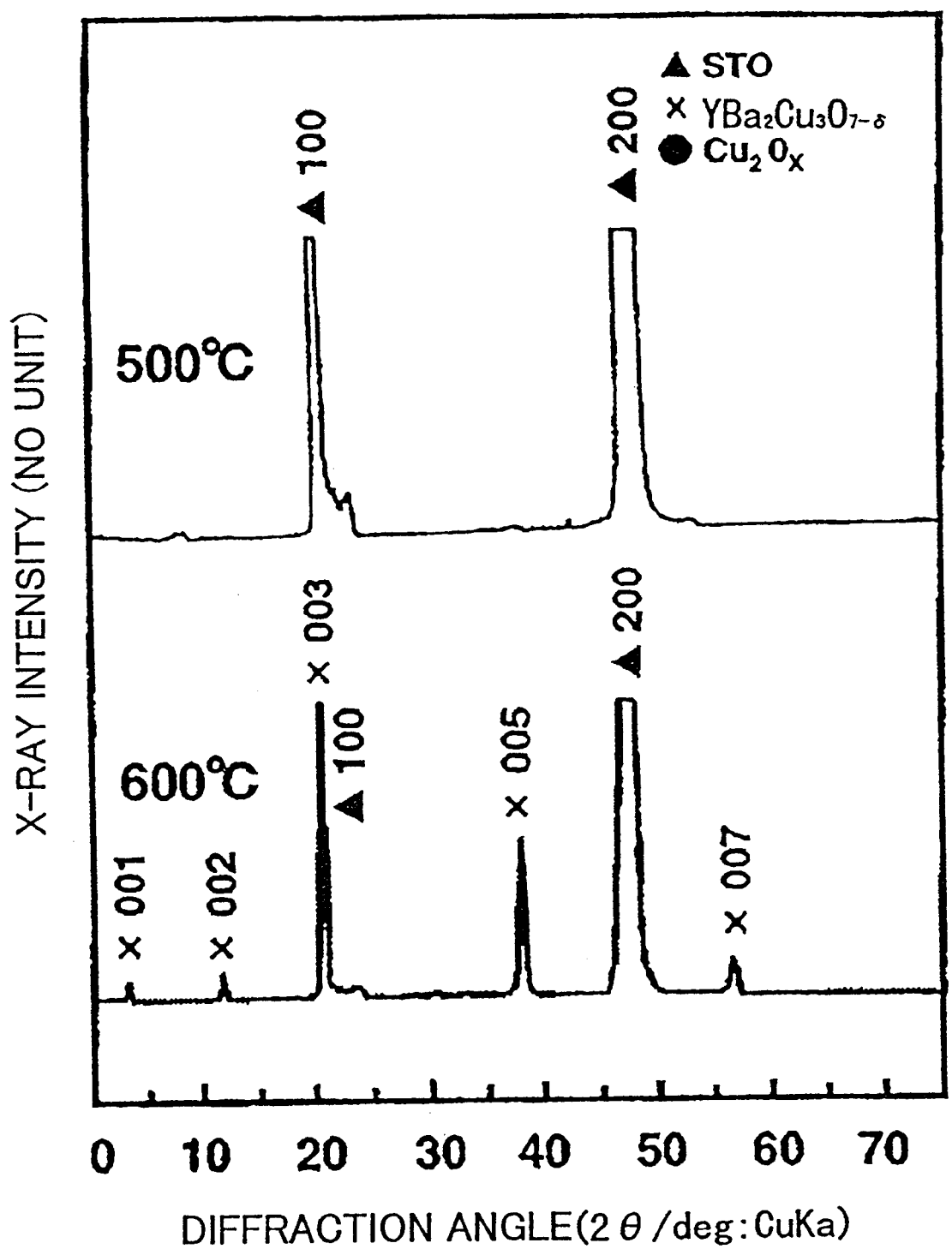
FIG. 6 is a graph showing an X-ray diffraction spectrum of the thin metal oxide film obtained in practical example 2.

The result shown in FIG. 6 reveals that the thin film in practical example 2 has a singe phase of $YBa_2Cu_3O_{7-\delta}$ at a sintering temperature of 600° C. and that, because its peaks can be indexed as (00c), the obtained thin film is oriented along c-axis. From this result, it is confirmed that the thin film has grown epitaxially. In addition, when observed with an atomic force microscope, the thin film surface was found to have an excellent surface smoothness.

Figure 7:
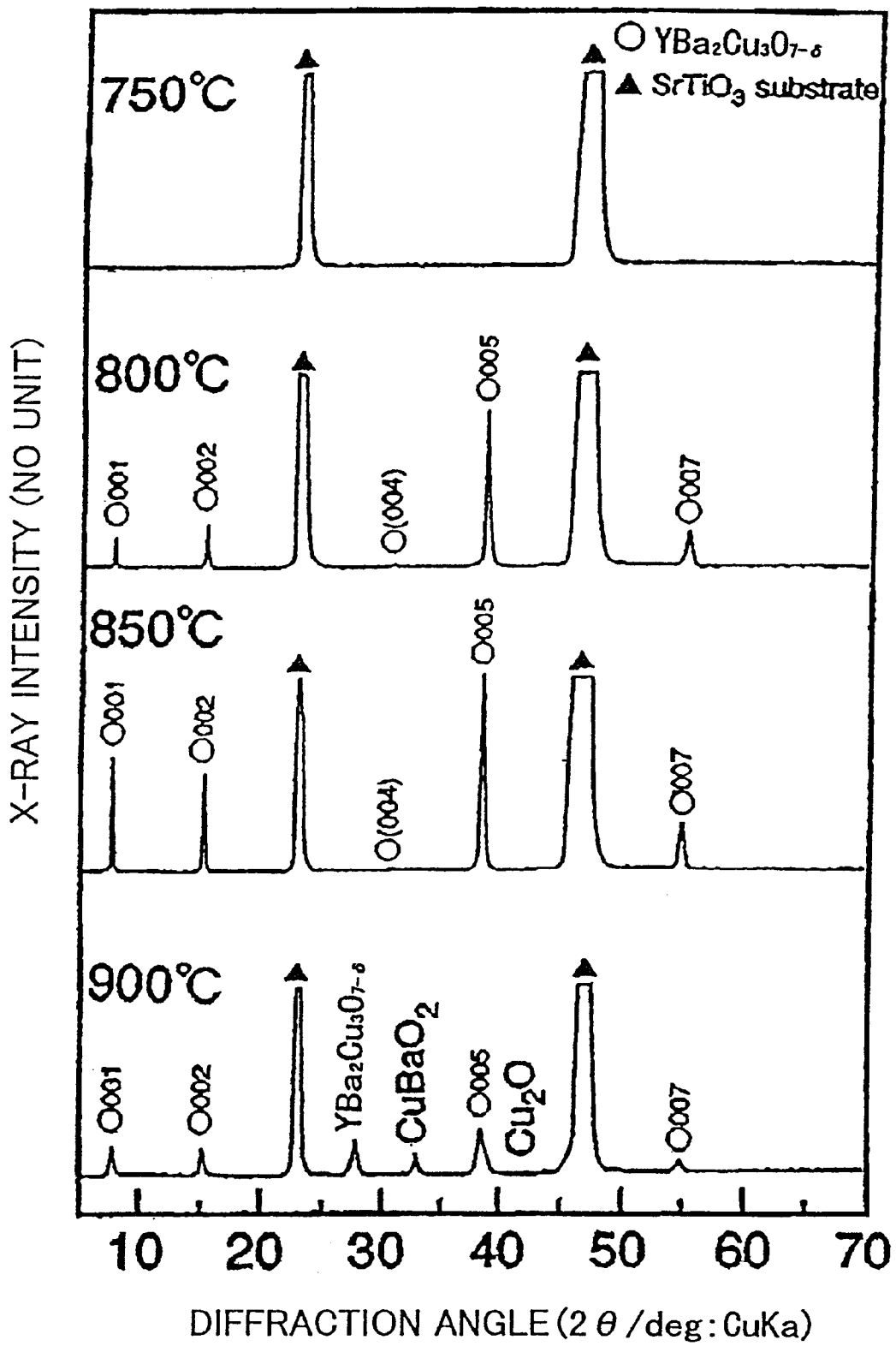
FIG. 7 is a graph showing an X-ray diffraction spectrum of the thin metal oxide film obtained in comparative example 2.

On the other hand, the thin film in comparative example 2 has no phase of $YBa_2Cu_3O_{7-\delta}$ at a sintering temperature of 750° C. as shown in FIG. 7. When the sintering temperature is raised to 800° C., the thin film has a single phase of $YBa_2Cu_3O_{7-\delta}$ and is oriented axially. This means the thin film has grown epitaxially. The surface of the thin film, however, was found to have a poor surface smoothness when observed with an atomic force microscope.

Reference Example 1

11.680 g (0.04 mol) of ethylenediaminetetraacetic acid was mixed with water in a 200 ml beaker so as to give a solution having total amount of 150 ml, followed by stirring and heating. Then, with stirring at a liquid temperature of 60° C., 4.429 g (0.03 mol) of strontium carbonate was slowly added to the solution not to overflow.

The obtained solution was maintained at 60° C. for 30 minutes and then cooled to the room temperature. Subsequently, 5.284 g (0.03 mol) of L(+)-ascorbic acid and 11.222 g (titanium: 0.03 mol) of salt of ethylenediaminetetraacetic acid-ammonium titanium(III) were added to the solution in sequence. Then 6.5 g of ammonia water was added to the obtained mixture solution to give a pH 4.5 reaction liquid in which the products in the mixture solution completely dissolved. To the reaction liquid, water was added so as to give a total amount of 200 g, to obtain a transparent dark auburn aqueous solution of the organic metal chelate complex mixture. The aqueous solution was dried by using a spray dryer at a drying temperature of 140° C. and a solution processing rate of 200 ml/hr to give 18 g of an amorphous powder of the organic metal chelate complex mixture.

The obtained amorphous powder was then sintered at 500° C. or 600° C. for 3 hours by using a nonpressure electric furnace to obtain a metal oxide powder.

Comparative Reference Example 1

EDTA strontium ammonium: 13.43 g (0.03 mol) and EDTA titanium (III) ammonium: 11.40 g (0.03 mol) were respectively measured and then there were mechanically well-mixed in a mortar. Subsequently, the obtained powder of the complex mixture was sintered at 700° C., 750° C. or 800° C. for 12 hours by using a nonpressure electric furnace to obtain a metal oxide powder.

Evaluation Test 3

Figure 8:
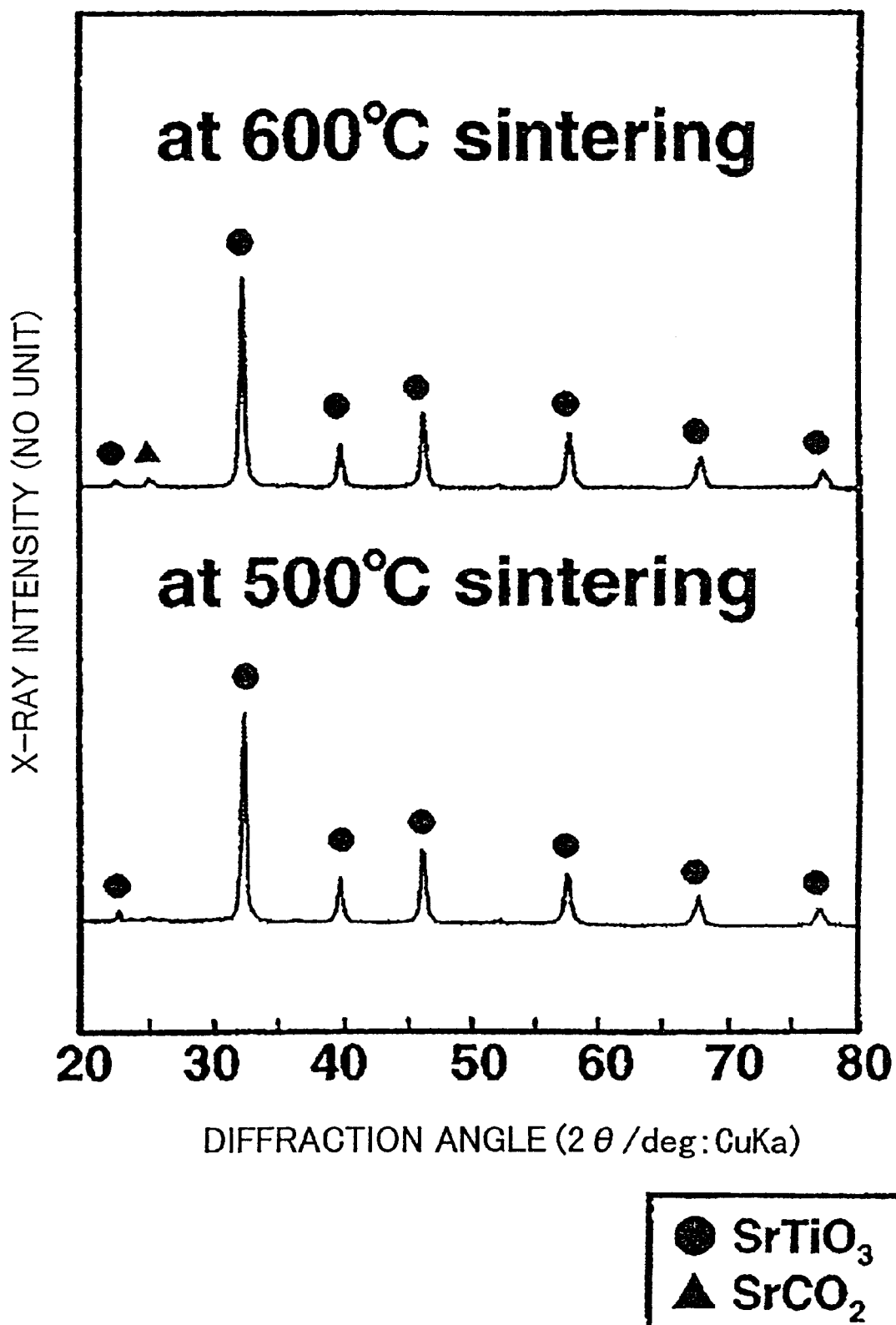
FIG. 8 is a graph showing an X-ray diffraction spectrum of the metal oxide powder obtained in reference example 1.
Figure 9:
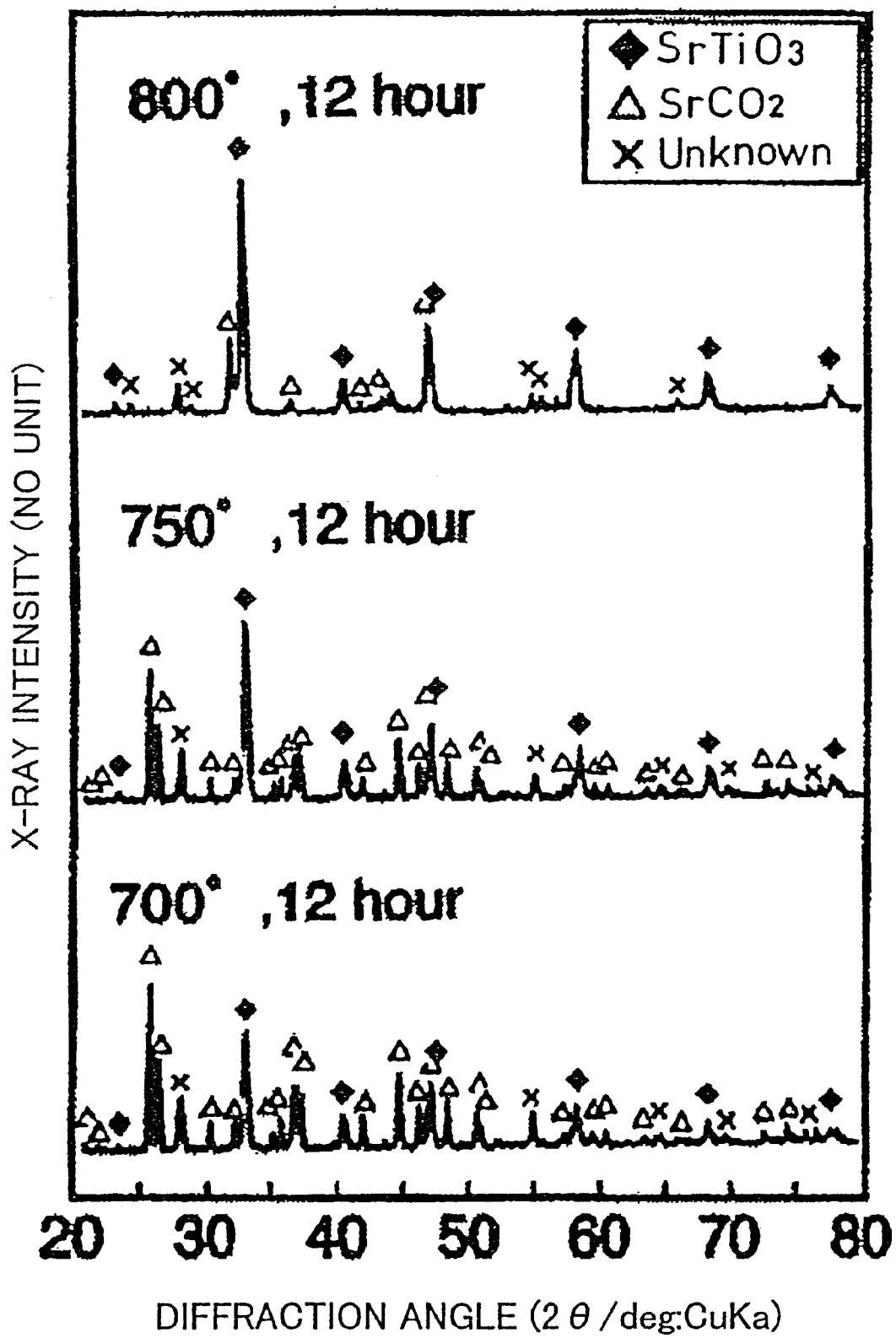
FIG. 9 is a graph showing an X-ray diffraction spectrum of the metal oxide powder obtained in comparative reference example 1.

FIGS. 8 and 9 respectively show x-ray diffraction spectra of the metal oxide powders obtained in reference example 1 and comparative reference example 1. Comparing these figures proved as follows. The powder in reference example 1 has a single phase of $SrTiO_3$ at 500° C. On the other hand, the powder at 700° C. in comparative reference example 1 has a phase of $SrTiO_3$ partially and, in addition, a different phase of $SrCO_2$. Furthermore, even when the sintering temperature in comparative reference example 1 is raised up to 800° C., the obtained powder cannot has the SrTiO₃ phase as a single phase.

Reference Example 4

119.88 g (0.40×1.02 mol) of ethylenediaminetetraacetic acid was mixed with water in a 1 liter beaker so as to give a solution having a total amount of 700 ml, followed by stirring and heating. Then, with stirring at a liquid temperature of 60° C., 83.22 g (yttrium: 0.40 mol) of trihydrate of yttrium carbonate (yttrium amount: 43.0%) was slowly added to the solution not to overflow.

The obtained solution was maintained at 60° C. for 30 minutes and it was then cooled to the room temperature. Subsequently, 27 g of ammonia water was added to the solution to give a pH 8.0 reaction liquid in which the products in the solution completely dissolved. To the reaction liquid, water was added so as to give a total amount of 1000 g, to obtain a transparent and colorless aqueous solution of the organic metal chelate complex. The aqueous solution was dried by using a spray dryer at a drying temperature of 150° C. and a solution processing rate of 500 ml/hr to give 112 g of an amorphous powder of the organic metal chelate complex.

The obtained amorphous powder was the sintered at 450° C., 600° C., 800° C. or 1000° C. for 5 hours by using a tube furnace at a flow rate of air or oxygen of 0.9 ml/min, to obtain a yttrium oxide (yttria) powder.

Comparative Reference Example 2

EDTA yttrium ammonium was sintered at 450° C., 600° C., 800° C. or 1000° C. for 5 hours by using a tube furnace at a flow rate of air or oxygen of 0.9 ml/min, to obtain a yttrium oxide (yttria) powder.

Evaluation Test 4

Figure 10:
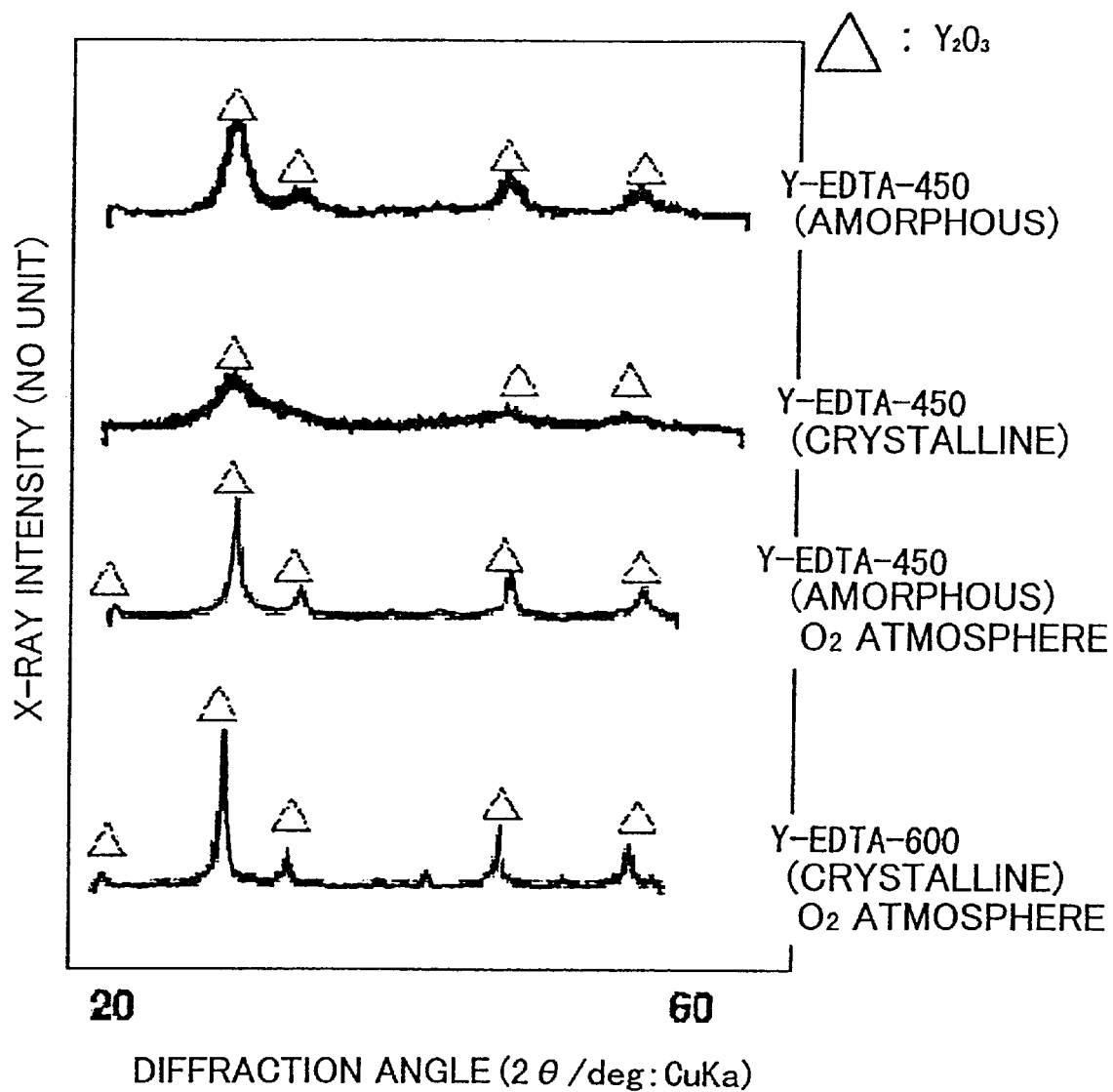
FIG. 10 is a graph showing an X-ray diffraction spectrum of the metal oxide powder obtained in reference example 2.
Figure 11:
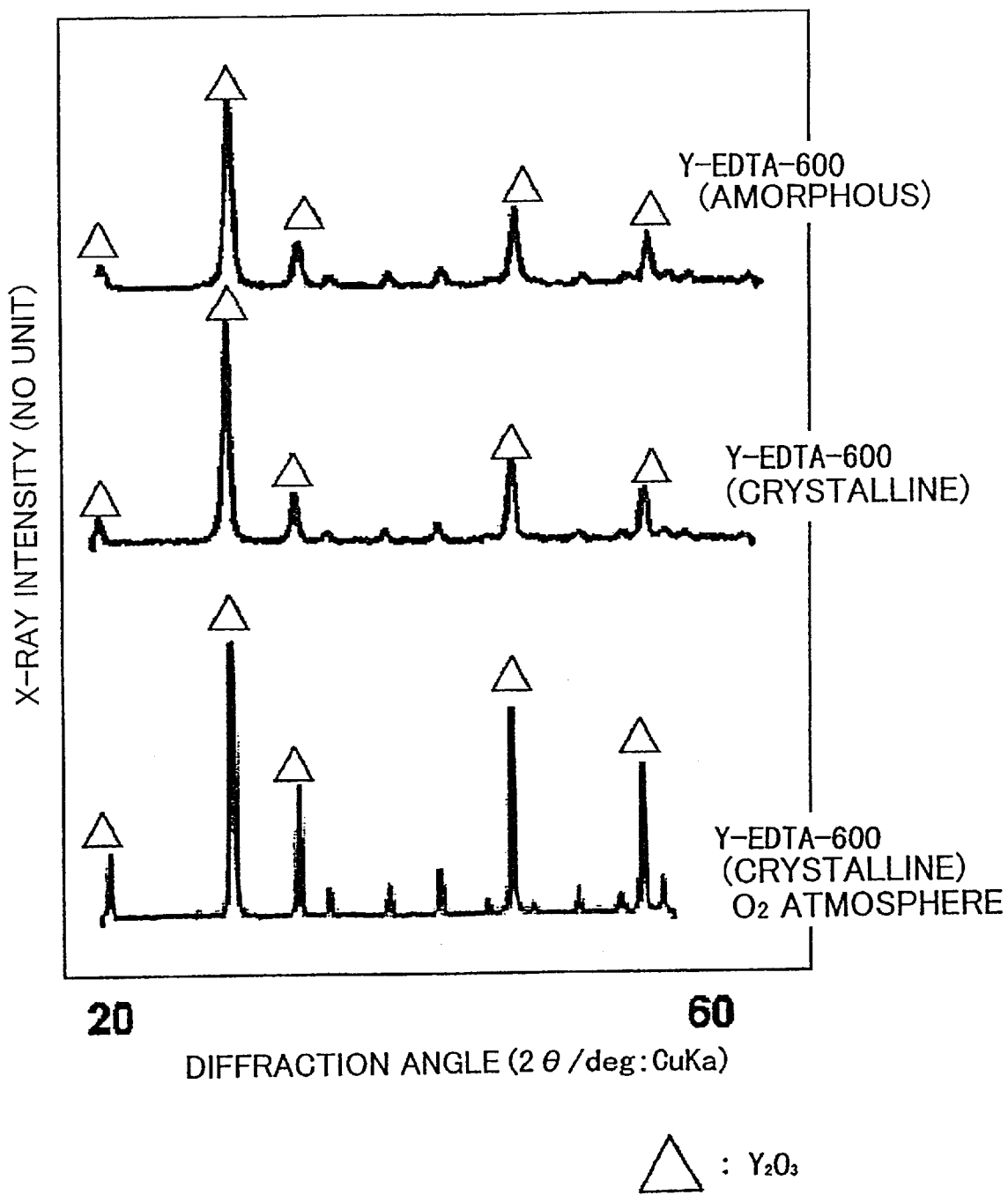
FIG. 11 is a graph showing an X-ray diffraction spectrum of the metal oxide powder obtained in comparative reference example 2.
Figure 12:
FIG. 12 are pictures by SEM of respective powders of metal chelate complexes used in reference example 2 and comparative reference example 2 and of the metal oxides obtained by sintering the respective powders at 450° C.
Figure 12:
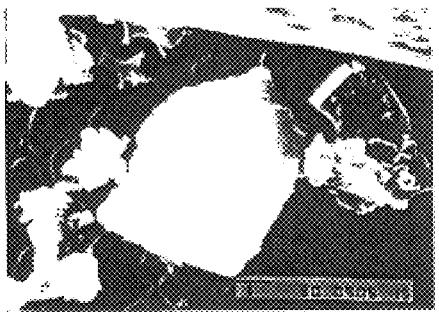
Figure 12:
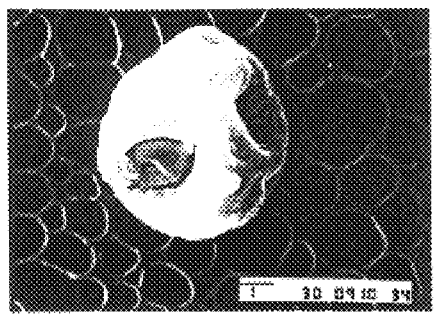
Figure 12:
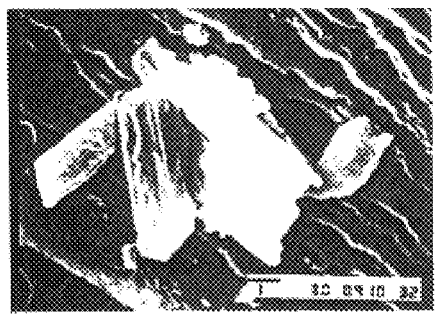
Figure 13:
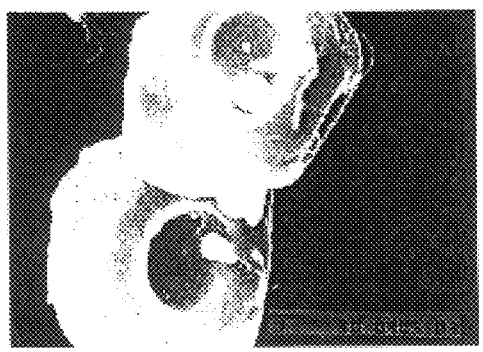
FIG. 13 are pictures by SEM of the metal oxides obtained by sintering the respective powders of metal chelate complexes at 600 or 800° C. in reference example 2 and comparative example 2.
Figure 13:
Figure 13:
Figure 13:
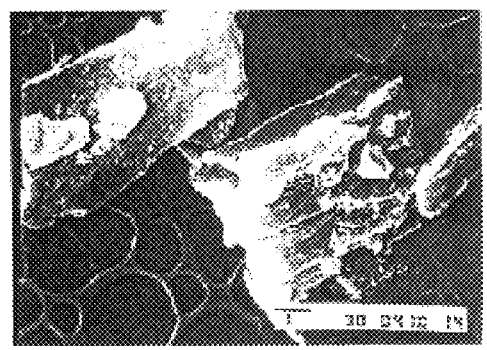
Figure 14:
FIG. 14 are pictures by SEM of the metal oxides obtained by sintering the respective powders of metal chelate complexes at 1000° C. in reference example 2 and comparative reference example 2.
Figure 14:
Figure 14:
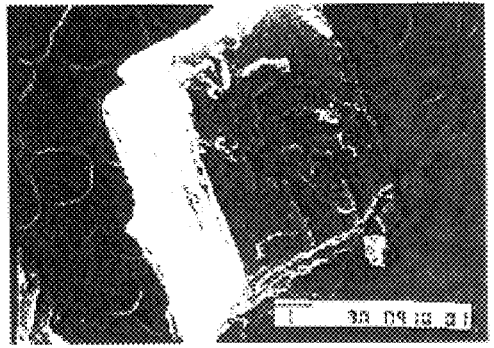
Figure 14:

FIGS. 10 and 11 show the x-ray diffraction spectra of the metal oxide powders obtained in reference example 2 and comparative reference example 2 respectively. Additionally, FIGS. 12 to 14 show SEM photographs of each powdery raw material and each powder obtained by sintering at respective temperatures in those examples.

The results shown in FIGS. 10 and 11 reveals that, in reference example 2, peaks of $Y_2O_3$ are detected even in the spectrum of the powder sintered at 450° C. in air. In this example, it is also found that the powder sintered in the oxygen atmosphere is a highly crystallized yttria. Furthermore, accordingly to FIGS. 12 and 14, the sintered powder in the reference example 2 has a bit compressed spherical shape, resulting from the shape of its powdery raw material. On the other hand, in the comparative reference example 2, only traces of $Y_2O_3$ peaks are observed in the spectrum of the powder sintered at 450° C. That is, yttria is hardly produced at this temperature. In addition, this sintered powder has a directional plate crystal.

Reference Example 3

An amorphous powder was obtained in the same manner as reference example 1. The amorphous powder was molded into a cylindrical pellet having a diameter of 10 mm and a thickness of 5 mm by CIP at the pressure of 1000 kg/m², to be used as a target.

By using the obtained target, a thin metal oxide film was formed as follows with the apparatus shown in FIG. 5.

Target 2 was mounted on target-supporting table 1. Then a pressure in vacuum chamber 4 was reduced to 0.01 Torr by oil-sealed rotary pump 3. Subsequently, an oxygen gas was introduced at a flow rate of 2 ml/min thorough oxygen inlet 5 so as to adjust a partial pressure in oxygen to 0.15 Torr. By using KrF-excimer laser 6, a laser ($\lambda$=248 nm) was irradiated on target 2 through quartz window for introducing laser 7. In the irradiation, a power density and a pulser rate were set to 0.5 J/cm² and 1 Hz respectively. By such an irradiation, a thin film of SrTiO₃ was deposited on a single-crystal SrTiO₃ (100) substrate 9 which has been heated to 800° C. by substrate-heating table 8. Similarly to practical example 1, target-supporting table 1 was constantly cooled by liquid nitrogen. The distance between target 2 and substrate 9 was set to 300 mm. The deposition time of the thin film was set to 2to 30 minutes and then the change of the thin film was observed.

Figure 15:
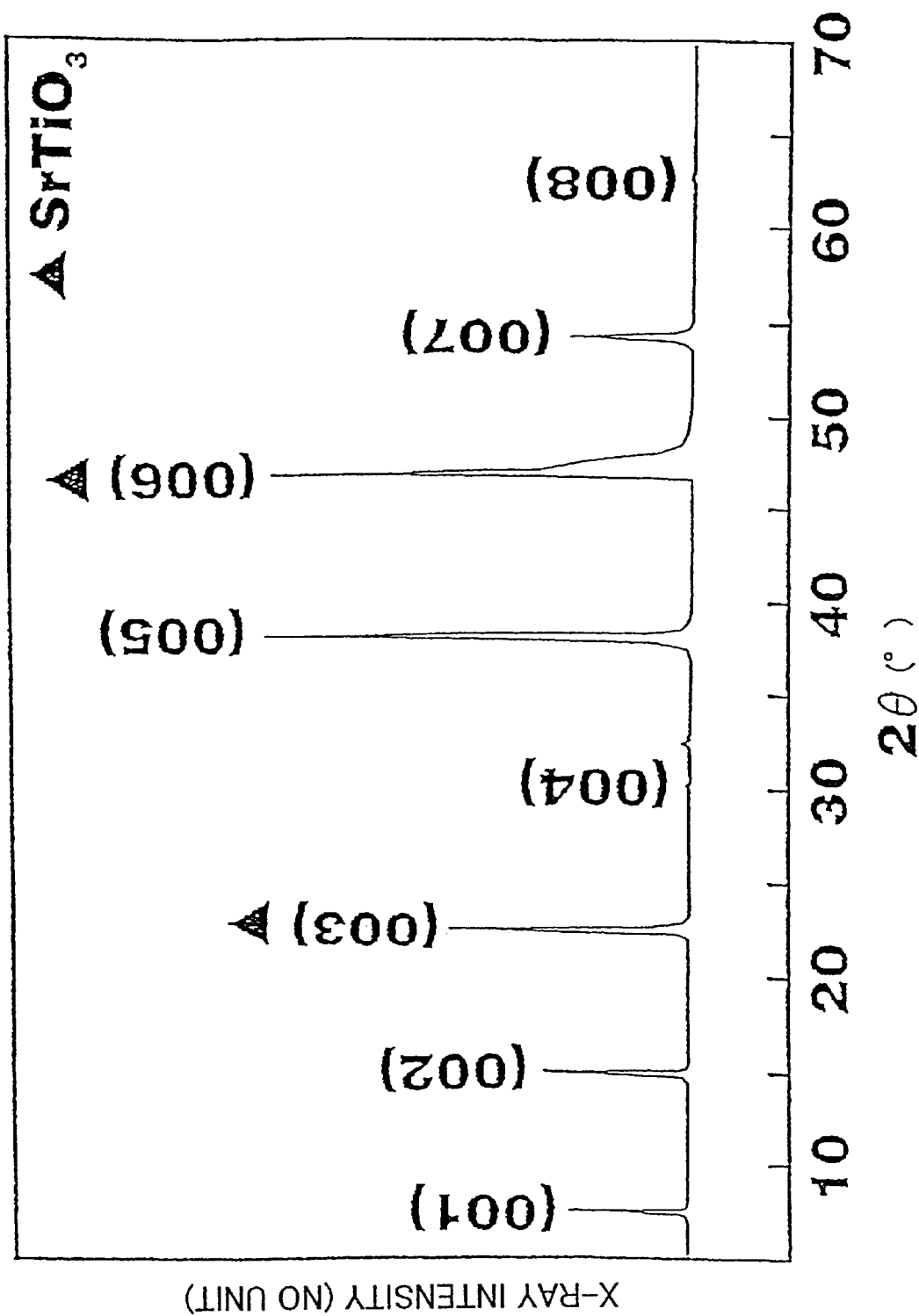
FIG. 15 is a graph showing an x-ray diffraction spectrum of the thin metal oxide film obtained in practical example 3.

As to the obtained thin metal oxide film the crystal structure analysis was performed by the x-ray diffraction. The result is shown in FIG. 15. This result reveals that, since its peaks can be indexed as (00c), the obtained thin film is oriented along c-axis and thereby the thin film has grown epitaxially. By the observation with an atomic force microscope, it was found that the thin film surface has an excellent surface smoothness and that the size of grains that have grown extraordinarily is not varied depending on the deposition time.

Advantageous

The present invention is configured as described above. By using the target obtained by molding the organic metal chelate complexes-containing powder into a tablet, it is possible to produce a high-quality thin film of multi-element metal oxide having an excellent surface smoothness more speedily with lower energy and cost. In addition, in the method according to the present invention, a composition of the thin film is easily controllable in any component system.

Particularly, when producing a thin film of multi-element metal oxide according to the present invention, the composition of the thin film is satisfactorily controllable. In addition, it is possible to easily provide a high-quality thin film of multi-element metal oxide having an excellent surface smoothness speedily with lower energy and cost due to the epitaxial growth. Therefore, the present invention can be quite widely applicable.

What is claimed is:

1. A process for preparing a target for use in production of a thin metal oxide film, comprising
   molding an amorphous powder of organic metal chelate complexes to obtain the target.

2. The process for preparing the target according to claim 1, further comprising,
   mixing metallic materials with an organic chelating agent so as to give a predetermined metal composition to prepare a transparent aqueous solution of organic metal chelate complexes, and
   spray-drying the aqueous solution to obtain an amorphous powder of the organic metal chelate complexes.

3. The process for preparing the target according to claim 2, wherein the organic metal chelate complexes are mixed homogeneously with each other at a molecular level in the amorphous powder.

4. The process for preparing the target according to claim 2, wherein the organic chelating agent is an amino-carboxylic acid chelating agent which is not thermally decomposed at a temperature of 200° C. or less.

5. The process for preparing the target according to claim 2, wherein the organic chelating agent with at least stoichiometric quantity of the metallic materials is mixed with the metallic materials to allow all of the metallic materials for forming complex salts to prepare the transparent aqueous solution.

6. The process for preparing the target according to claim 2, further comprising adding at least one of a reducing agent and an antioxidant to the aqueous solution of the organic chelate complexes to prevent the oxidation of metal ions therein.

7. The process for preparing the target according to claim 2, wherein the organic metal chelate complexes are multi-element organic metal chelate complexes.

8. The process for preparing the target according to claim 1, wherein the target is in the shape of a tablet.

9. The process for preparing the target according to claim 2, wherein the target is in the shape of a tablet.

10. The process for preparing the target according to claim 1, wherein said step of molding the amorphous powder is conducted at a pressure of 200 to 1000 $Kg/m^3$.

11. The process for preparing the target according to claim 2, wherein said step of molding the amorphous powder is conducted at a pressure of 200 to 1000 $Kg/m^3$.

* * * * *

UNITED STATES PATENT AND TRADEMARK OFFICE
CERTIFICATE OF CORRECTION

PATENT NO. : 6,589,453 B1
DATED : July 8, 2003
INVENTOR(S) : Hidetoshi Saitoh et al.

It is certified that error appears in the above-identified patent and that said Letters Patent is hereby corrected as shown below:

<u>Title page,</u>
Item [30], Foreign Application Priority Data, "10-227492" should read
-- 10-277492 --

Signed and Sealed this

Twenty-first Day of June, 2005

JON W. DUDAS
*Director of the United States Patent and Trademark Office*